(12) United States Patent
Lim et al.

(10) Patent No.: US 8,362,603 B2
(45) Date of Patent: Jan. 29, 2013

(54) FLEXIBLE CIRCUIT LIGHT-EMITTING STRUCTURES

(75) Inventors: Michael Lim, Cambridge, MA (US); Mark J. Czoschke, Bedford, NH (US); Alexei A. Erchak, Cambridge, MA (US)

(73) Assignee: Luminus Devices, Inc., Billerica, MA (US)

( * ) Notice: Subject to any disclaimer, the term of this patent is extended or adjusted under 35 U.S.C. 154(b) by 387 days.

(21) Appl. No.: 11/855,597

(22) Filed: Sep. 14, 2007

(65) Prior Publication Data

US 2008/0067533 A1   Mar. 20, 2008

Related U.S. Application Data

(60) Provisional application No. 60/844,720, filed on Sep. 14, 2006.

(51) Int. Cl.
*H01L 23/48* (2006.01)
(52) U.S. Cl. ............. 257/688; 257/88; 257/91; 257/98; 257/712; 257/E33.001
(58) Field of Classification Search ............ 257/88, 257/91, 98, 688, 712
See application file for complete search history.

(56) References Cited

U.S. PATENT DOCUMENTS

| | | | |
|---|---|---|---|
| 6,613,597 | B2 | 9/2003 | Stack |
| 6,711,200 | B1* | 3/2004 | Scherer et al. ............. 372/64 |
| 6,831,302 | B2 | 12/2004 | Erchak et al. |
| 7,105,861 | B2 | 9/2006 | Erchak et al. |
| 7,166,871 | B2 | 1/2007 | Erchak |
| 7,170,100 | B2 | 1/2007 | Erchak et al. |
| 7,598,531 | B2 | 10/2009 | Erchak et al. |
| 7,692,207 | B2 | 4/2010 | Erchak et al. |
| 7,993,940 | B2 | 8/2011 | Pumyea |
| 2004/0223328 | A1* | 11/2004 | Lee et al. ............. 362/249 |
| 2004/0227146 | A1* | 11/2004 | Wu ............. 257/99 |
| 2006/0098438 | A1* | 5/2006 | Ouderkirk et al. ............ 362/294 |
| 2006/0163587 | A1 | 7/2006 | Erchak et al. |
| 2007/0045640 | A1 | 3/2007 | Erchak et al. |

* cited by examiner

*Primary Examiner* — Wai Sing Louie
(74) *Attorney, Agent, or Firm* — Wolf, Greenfield & Sacks, P.C.

(57) ABSTRACT

Light-emitting structures, and related components, systems, and methods associated therewith are provided. In one embodiment, a light-emitting structure includes at least one LED, a contact bond pad supported by the at least one LED, and a flexible circuit member bonded to the contact bond pad.

19 Claims, 6 Drawing Sheets

US 8,362,603 B2

FLEXIBLE CIRCUIT LIGHT-EMITTING STRUCTURES

RELATED APPLICATIONS

This application claims priority to U.S. Provisional Application Ser. No. 60/844,720 filed on Sep. 14, 2006 which is incorporated herein by reference.

FIELD OF THE INVENTION

The present embodiments are drawn generally towards light-emitting structures and devices, and more specifically to packages that are associated with light-emitting diodes (LEDs) as light sources. Specifically, the methods and systems of at least some of the embodiments include structures that comprise at least one flexible circuit member that can be bonded to at least one light-emitting diode.

BACKGROUND

A light-emitting diode often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays. Many technological advances have led to the development of high power LEDs by increasing the amount of light emission from such devices.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

Traditional light-emitting devices may have complex packages which may require multiple manufacturing steps in order to form a packaged LED. For example, as shown in FIG. 1, a light-emitting structure 100 may include a light-emitting diode 102 and a transparent layer 103 (e.g., a window) supported by a package 104. Typically, contacts 106 can be attached via solder or electrically conductive adhesive 108 to the package 104. The contacts 106 can be disposed between the package and a supporting structure 110 (e.g., core board). The package 104 can include electrically conductive vias 124 (e.g., metal-filled vias). Additionally, some light-emitting structures incorporate an electrically isolating dielectric material 112 between the support structure and the circuit board contacts.

Light-emitting devices also generally include one or more electrical contact bond pads 114 (also known as electrodes) which are features on a device that may be electrically connected via wire bonds 116 to a wire bond pad contact 118 which in turn can receive power from a power source (not shown). Typically, wire bonds 116 are soldered 120 to the wire bond pad contacts 118 and the electrical contact bond pad 114, as illustrated in FIG. 2. Electrical current can be provided from the power source to the device via the wire bond pads 118 and electrical contact bond pad. In addition, the electrical contact bond pad 114 can include current spreading members 122 (e.g., metal fingers) which are capable of delivering current along the lengths thereof and to the surface of the LED 102.

The complexity of such LED devices and multiple manufacturing steps involved in fabricating such devices inevitably increases production time and costs. Further, the wire bonds tend to have small diameters which further can add to the fabrication complexity and production time. Also, the wire bonds can be current limiting due to their small diameters.

SUMMARY

Light-emitting structures, and related components, systems, and methods associated therewith are provided.

In one embodiment, a light-emitting structure, comprising at least one LED, a contact bond pad supported by the at least one LED, and a flexible circuit member bonded to the contact bond pad.

In one embodiment, a light-emitting structure comprises a support structure, a flexible circuit member, and at least one LED supported by the support structure and attached to the flexible circuit member.

In one embodiment, a method for making a light-emitting structure comprises providing a flexible circuit member, and bonding the flexible circuit member to at least one contact supported by an LED.

In one embodiment, a light-emitting device comprises at least one LED and an optical member in contact with a top portion of the at least one LED, wherein a portion of the optical member has an index of refraction less than about 1.4.

In one embodiment, a light-emitting structure comprises a multi-layer semiconductor structure having one electrical contact pad supported by a top surface of the semiconductor structure and another electrical contact pad in contact with the opposite side of the semiconductor structure, and a flexible circuit bonded to at least one of the electrical contact pads.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Light-emitting structures including those which can have a low profile (e.g., small thickness) design are described herein. Light-emitting structures presented herein can be fabricated using a simplified manufacturing process. Some such light-emitting structures can be devoid of wire bonds which can allow for a low profile design.

In one embodiment, a light-emitting structure may include at least one light-emitting diode, a contact bond pad supported by the light-emitting diode and a flexible circuit member bonded (e.g., bump bonded) to the contact bond pad. The light-emitting devices can include a support structure for supporting a light-emitting diode semiconductor die.

Figure 1:
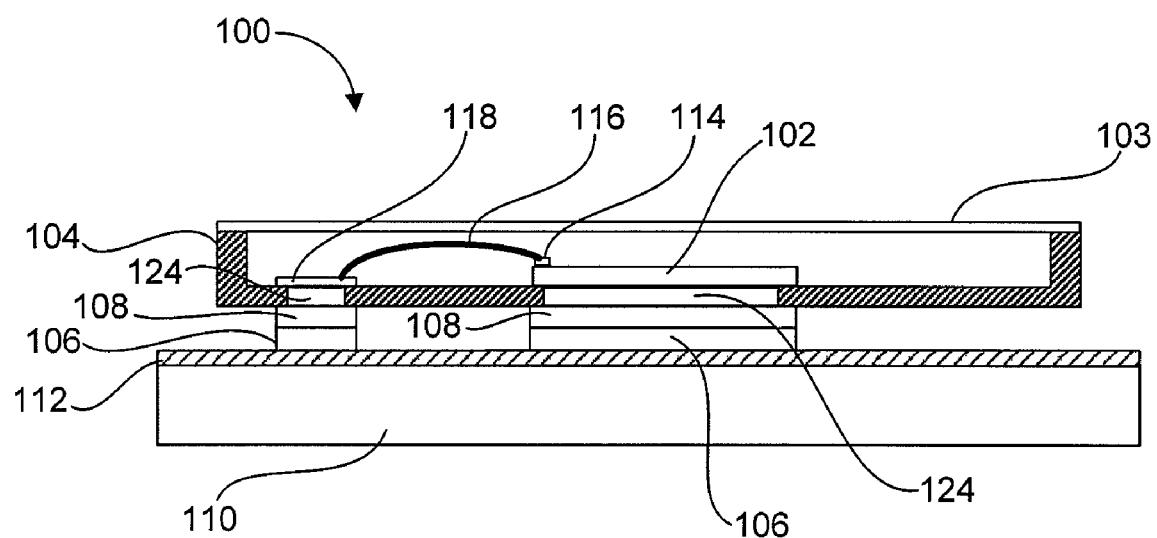
FIG. 1 is a schematic of a representative prior art LED structure.

FIG. 1 depicts a light-emitting structure that may be utilized in a number of applications. Some of the major elements included in the light-emitting structure 100 can be at least one light-emitting diode (LED) 102, a package 104 for supporting the LED, a support 110 (e.g., core-board) for supporting the package, an electrode contact bond pad 114 supported by the LED surface, wire bond contact bond pad 118 attached to the package, wire bonds 116 for electrically connecting electrode contact bond pad 114 with the wire bond contact pad 118, and window 103 which can hermetically seal the package. Furthermore, light emitted from the light-emitting device can be lost prior to being coupled to an optical component (e.g., an optic such as a lens or light guide) since the optical component is separated from the LED 102 light emission surface.

Figure 2:
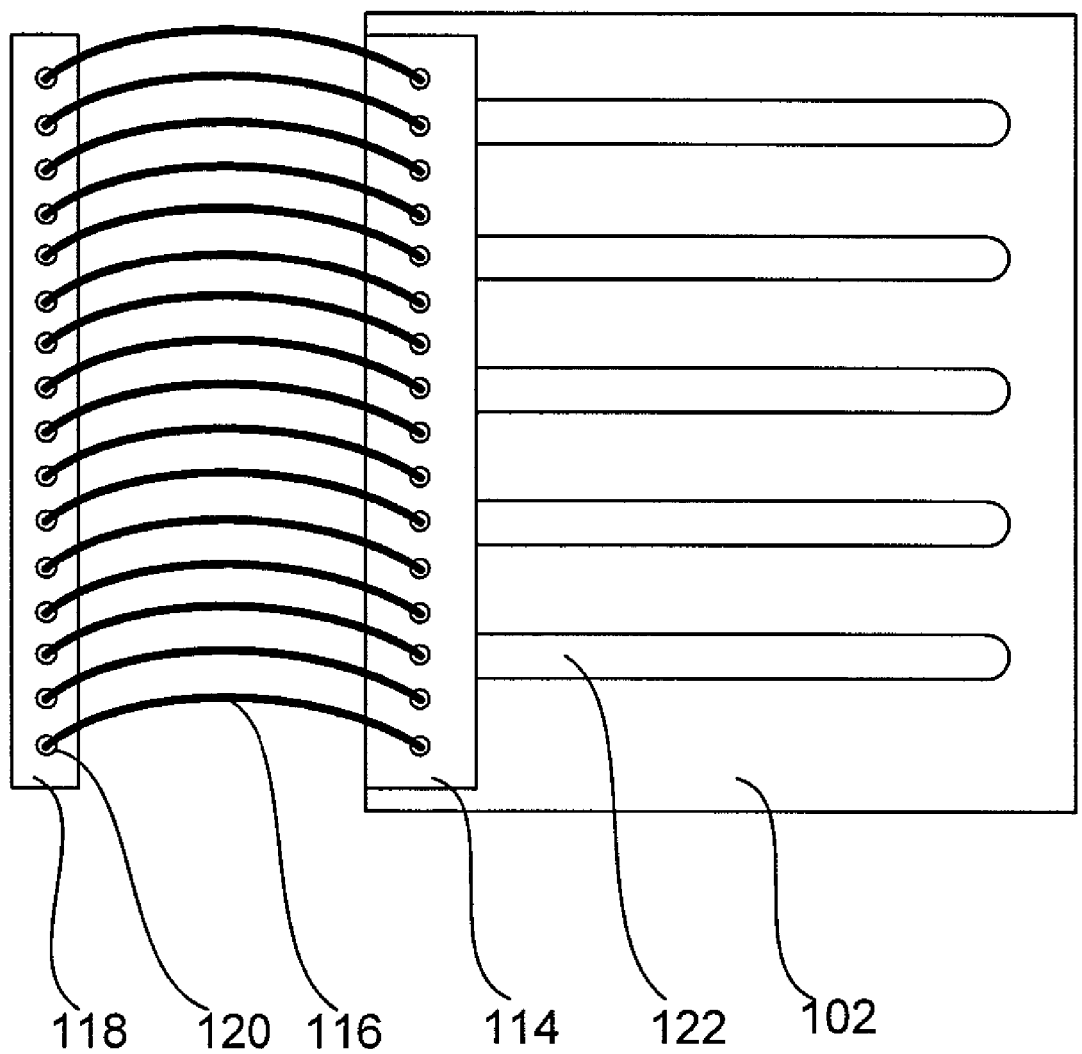
FIG. 2 shows a top view of a prior art LED structure.

FIG. 2 shows a top view of light-emitting structure 100. As shown, LED 102 may have a top surface that can support at least one electrode contact bond pad 114 and at least one current spreading layer 122. The current spreading layer 122 includes electrically conductive fingers (e.g., metal fingers). Wire bonds 116 are soldered 120 to the electrode contact bond pad 114 and the wire bond contact pad 118 to form an electrical pathway. Typically, multiple wire bonds and a current spreading layer are used to uniformly distribute electrical current to the entire surface of a large LED (e.g., having an area larger than 1 mm$^2$).

Figure 3:
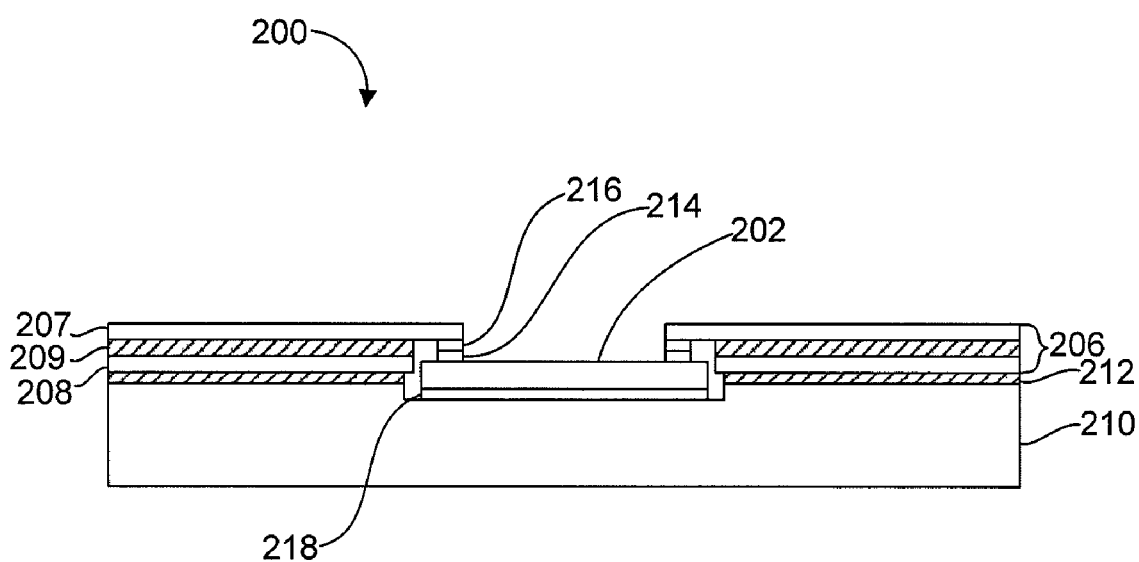
FIG. 3 shows a side view of an LED structure in accordance with one embodiment.

FIG. 3 illustrates an embodiment of an illumination system 200 which may have a number of advantages over conventional structures and systems. System 200 may include a support 210 (e.g., a metal core-board) for supporting at least one LED 202 and a flexible circuit member 206. In some embodiments, the LED 202 can have a large die area (e.g., greater than about 1 mm$^2$, greater than about 3 mm$^2$, greater than about 5 mm$^2$, greater than about 10 mm$^2$).

An LED, as discussed herein, may be an LED die, two or more associated LED dies, a partially packaged LED die or dies, or a fully packaged LED die or dies. An example of an LED that includes two or more LED dies associated with one another is a red-light-emitting LED die associated with a green-light-emitting LED die and a blue-light-emitting LED die. The two or more associated LED dies may be mounted on a common substrate (e.g., a common package). The two or more LED dies may be associated such that their respective light emissions may be combined to produce a desired spectral emission. The two or more LED dies may also be electrically associated with one another (e.g., connected to a common ground).

In some embodiments, an LED is a single-colored LED that emits light of a single color. For example, the LED may be an R LED (i.e., a red LED), a G LED (i.e., a green LED), a B LED (i.e., a blue LED), a Y LED (i.e., a yellow LED), or a C LED (i.e., a cyan LED). In other embodiments, the LED is a multi-colored LED that emits light having a spectrum of wavelengths. For example, the LED may be a RGB LED (i.e., a red-green-blue LED). In other embodiments, an LED is a RGBY LED (i.e., a red-green-blue-yellow LED). In yet other embodiments, an LED is a RGBC LED (i.e., a red-green-blue-cyan LED). In yet other embodiments, an LED is a RGBCY LED (i.e., a red-green-blue-cyan-yellow LED). In still another embodiment, the LED may be a phosphor cover LED configured to produce a white light, (i.e., a blue LED covered with a yellow phosphor material. Of course, LEDs of different colors can also be used in embodiments of the invention.

In some embodiments, LED 202 is at least one LED having a rectangular aspect ratio. For example, the rectangular aspect ratio can be a 4×3 or 16×9 aspect ratio. In some embodiments, LED 202 comprises an array of LEDs. The array of LEDs can have an outer perimeter that has a rectangular aspect ratio.

Other features of some embodiments are illustrated in FIG. 3, such as a flexible circuit member 206. In one embodiment, flexible circuit member 206 may comprise a lower metallic layer 208, a dielectric material 209 and an upper metallic layer 207. The dielectric material 209 may be disposed between the two metallic layers to electrically isolate the two metallic layers from each other. In some embodiments, layers 207 and 208 can be comprised of any material(s) that are electrically conductive. For example, metals such as copper, aluminum, gold, or gold plated metal may be used to form layers 207 and/or 208. Other metals or metal alloys known to those skilled in the art may be used to form layers 207 and/or 208. In other embodiments, a lower metallic layer 208 may be absent. In some embodiments, upper metallic layer 207 and/or lower metallic layer 208 may take the form of circuit trace lines.

The thickness of each layer of metal of the flexible circuit member can be thin enough to bend or flex (e.g., during assembly of flexible member 206). For example, layers 207 and/or 208 may be about 100 nm to about 5 mm thick. Dielectric material 209 may be any material that can be electrically insulating, such as an oxide, a ceramic, and/or a polymer (e.g., polyimide). In some embodiments, dielectric material 209 may be thermally conducting (e.g., possessing a high thermal conductivity) thereby allowing for heat generated by the LED to be conducted effectively through all the layers (e.g., layers 207, 209, and 208) of the flexible circuit 206.

In some embodiments, flexible circuit member 206 may be supported and/or attached to support 210 (e.g., a metal core-board substrate). For example, an adhesive layer 212 (e.g., comprised of a dielectric material or a metallic solder) may be used to attach flexible circuit member 206 to support 210. Adhesive layer 212 may be electrically insulating. In some embodiments, the adhesive layer may be thermally conducting. An adhesive layer 218 can be used to attach the LED 202 to the core board 210. In some embodiments, adhesive layer 218 can be electrically conductive (e.g., a solder or electrically conductive epoxy) thereby providing for a backside electrical contact to the LED 202 via the support 210. For example, support 210 can be a metal core-board that is electrically conductive.

Electrical contact with the LED die can be provided by bonding the upper metallic layer 207 to an electrical contact bond pad 214 supported by the LED 202 top surface. In some embodiments, one or more contact bond pads are supported by or affixed to the LED in other ways, for example, one or more contact bond pads can be affixed to at least one side of the LED. Backside electrical contact to the LED die can be made via electrical contact of the backside of the LED 202 with support 210, as described above. In this manner the top and bottom of the LED die can be electrically contacted, however, it should be appreciated that other methods of providing electrical contact with the LED die are possible. For example, same-side electrical contacts are possible, as known by those skilled in the art.

Several methods can be used for bonding metallic layer 207 to the electrical contact bond pad 214 such as, soldering, bump bonding, wedge bonding, conductive polymer attachment, and epoxy attachment. As shown in FIG. 3, an attachment material 216 can provide for bonding between metallic layer 207 and electrical contact bond pad 214. The attachment material can include a metal (e.g., tin, gold, silver, aluminum). In some embodiments, any bonding technique known to those skilled in the art that is wire bond free (i.e., non-wire bond techniques) may be used.

A transparent layer (not shown) may be supported and/or attached to a portion of the top surface of the flexible circuit member 206. The transparent layer may be a window that is permanently or temporarily attached to the flexible circuit member 206 thereby protecting the LED 202. Notably, the transparent layer may be attached such that during transportation the LED is protected. Subsequent to transport the transparent layers can be removed prior to use in an application. In some embodiments, the transparent layer can be attached by using an attachment material (e.g., epoxy) which can seal (e.g., hermetically seal) the LED package.

Figure 4:
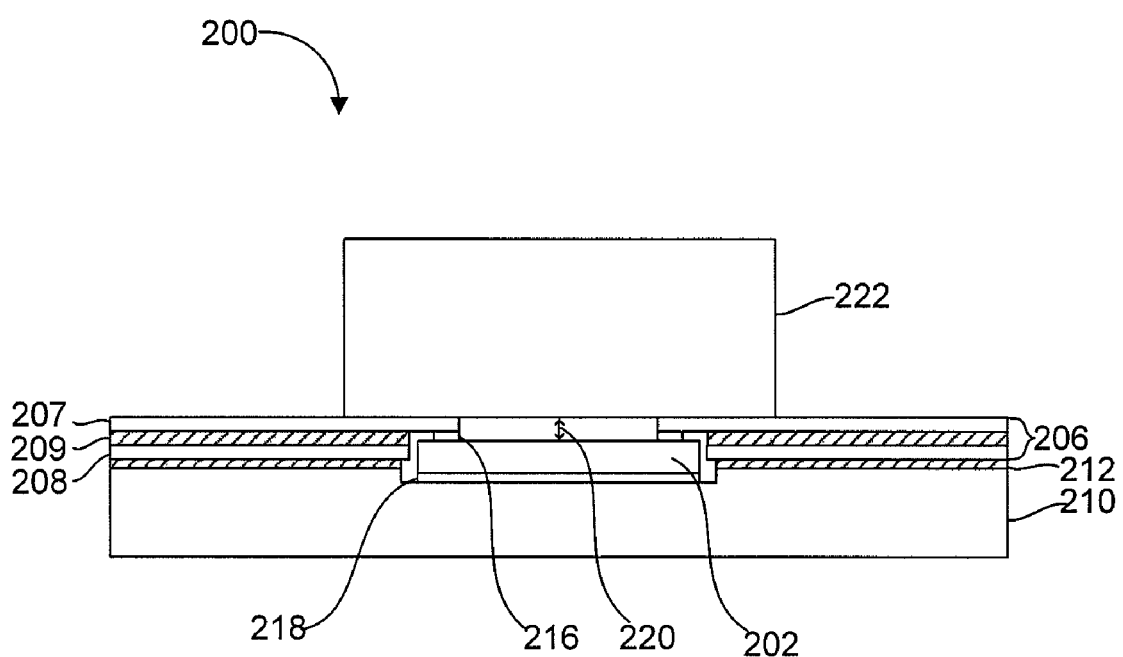
FIG. 4 shows a side view of an LED structure associated with an optical member in accordance with one embodiment.

FIG. 4 illustrates an embodiment of that can incorporate an optical member 222. The optical member 222 can be an imaging optical member (e.g., a lens, such as a spherical lens) or a non-imaging collection optical member (e.g., a light tunnel or a concentrator such as a compound parabolic concentrator). The optical member 222 can include a slab waveguide, a mirror, or a dichroic mirror. As shown in FIG. 4, the optical member 222 can be supported by (e.g., directly in contact with) the flexible circuit member 206, thereby reducing the distance 220 between the optical member and the LED 202. The optical member can be in direct contact with flexible circuit member 206. In some embodiments the optical member 222 is less than about 200 microns away from a top emission surface of the LED 202. In another embodiment, the optical member 222 is less than about 75 microns away from the top surface of the LED 202.

Figure 5:
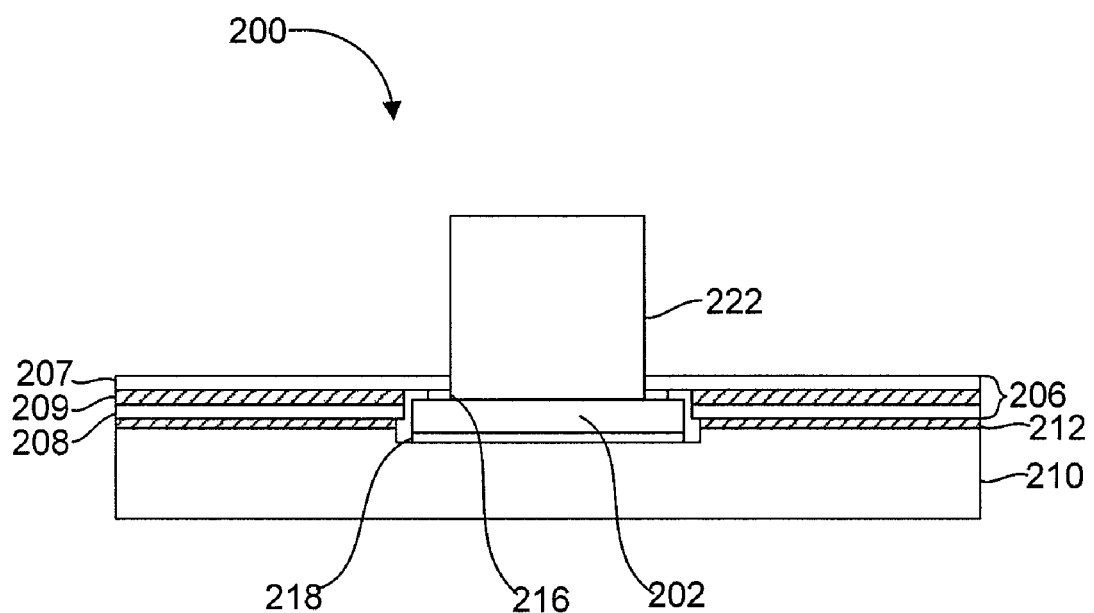
FIG. 5 shows a side view of an LED structure supporting an optical member in accordance with one embodiment.

FIG. 5 illustrates an embodiment where the optical member 222 can be directly supported on the top surface of LED 202. In some embodiments, the optical member can be any optical member other than an encapsulant. For example, optical member 222 can be a light tunnel specifically adapted to be supported by the surface of an LED having a large top surface area (e.g., greater than about 1 mm$^2$, greater than about 3 mm$^2$, greater than about 5 mm$^2$, greater than about 10 mm$^2$). By bringing the optical member 222 in direct contact or close proximity (e.g., less than about 1 mm, less than about 500 microns, less than about 200 microns, less than about 75 microns away) to the LED emission surface, light can be effectively coupled into the optical member. In some embodiments, an index matching layer (e.g., having similar refractive index as the optical member) is disposed on a top surface of the LED. In some embodiments, a substantial portion of the optical member has an index of refraction of less than about 1.4.

Figure 6:
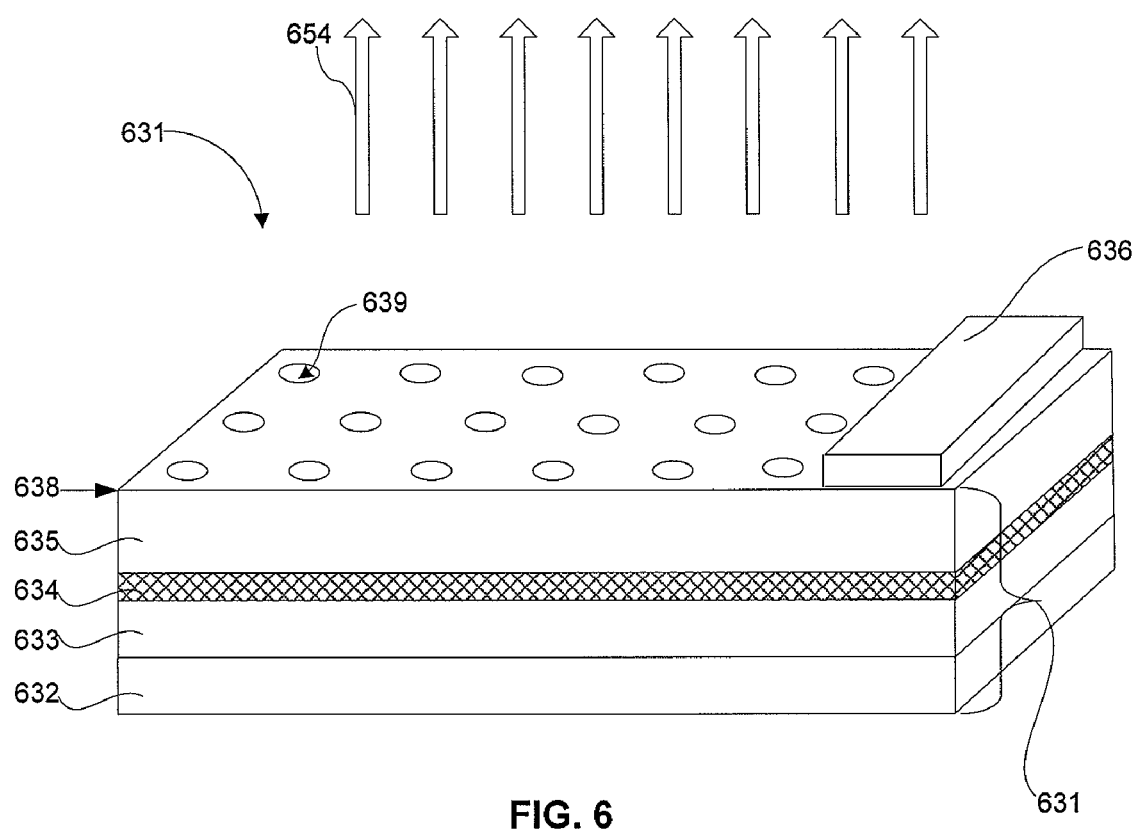
FIG. 6 shows an LED in accordance with one embodiment.

FIG. 6 illustrates an LED that may be used in connection with the embodiments described above. It should be understood that various embodiments presented herein can also be applied to other light-emitting dies, such as laser diode dies, and LED dies having different structures (such as organic LEDs, also referred to as OLEDs). LED die 631 shown in FIG. 6 comprises a multi-layer stack 631 that may be disposed on a support structure (not shown). The multi-layer stack 631 can include an active region 634 which is formed between n-doped layer(s) 635 and p-doped layer(s) 633. The stack can also include an electrically conductive layer 632 which may serve as a p-side contact, which can also serve as an optically reflective layer. An n-side contact pad 636 may be disposed on layer 635. Electrically conductive fingers (not shown) may extend from the contact pad 636 and along the surface 638, thereby allowing for uniform current injection into the LED structure.

It should be appreciated that the LED is not limited to the configuration shown in FIG. 6, for example, the n-doped and p-doped sides may be interchanged so as to form a LED having a p-doped region in contact with the contact pad 636 and an n-doped region in contact with layer 632. As described further below, electrical potential may be applied to the contact pads which can result in light generation within active region 634 and emission (represented by arrows 654) of at least some of the light generated through an emission surface 638. As described further below, holes 639 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 635 can include a silicon-doped GaN layer (e.g., having a thickness of about 4000 nm thick) and/or the p-doped layer(s) 633 include a magnesium-doped GaN layer (e.g., having a thickness of about 40 nm thick). The electrically conductive layer 632 may be a silver layer (e.g., having a thickness of about 100 nm), which may also serve as a reflective layer (e.g., that reflects upwards any downward propagating light generated by the active region 634). Furthermore, although not shown, other layers may also be included in the LED; for example, an AlGaN layer may be disposed between the active region 634 and the p-doped layer(s) 633. It should be understood that compositions other than those described herein may also be suitable for the layers of the LED.

As a result of holes 639, the LED can have a dielectric function that varies spatially according to a pattern. Typical hole sizes can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in the figure, the holes 639 can be non-concentric.

The dielectric function that varies spatially according to a pattern can influence the extraction efficiency and/or collimation of light emitted by the LED. In some embodiments, a layer of the LED may have a dielectric function that varies spatially according to a pattern. In the illustrative LED die 631 of FIG. 6, the pattern is formed of holes, but it should be appreciated that the variation of the dielectric function at an interface need not necessarily result from holes. Any suitable way of producing a variation in dielectric function according to a pattern may be used. For example, the pattern may be formed by varying the composition of layer 635 and/or emission surface 638. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. Patent Publication No. 20070085098, entitled "Patterned devices and related methods," filed on Mar. 7, 2006, which is herein incorporated by reference in its entirety.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total optical power divided by the emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$. However, it should be understood that the LEDs used in systems and methods presented herein are not limited to the above-described power and power flux values.

In some embodiments, the LED may be associated with one or more wavelength converting regions. The wavelength converting region(s) may include one or more phosphors and/or quantum dots. The wavelength converting region(s) can absorb light emitted by the light-generating region of the LED and emit light having a different wavelength than that absorbed. In this manner, LEDs can emit light of wavelength (s) (and, thus, color) that may not be readily obtainable from LEDs that do not include wavelength converting regions. In some embodiments, one or more wavelength converting regions may be disposed over (e.g., directly on) the emission surface (e.g., surface 38) of the light-emitting device.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting structure, comprising:
   at least one LED;
   a contact bond pad supported by a top surface of the at least one LED, the top surface including at least one portion through which light is emitted; and
   a flexible circuit member bonded to the contact bond pad, wherein the light-emitting structure is free of wire bonds.

2. The light-emitting structure of claim 1, wherein the flexible circuit member is bonded via one or more bump bonds, a solder bond, a thermosonic bond, an epoxy bond or a wedge bond.

3. The light-emitting structure of claim 1, further comprising a support structure configured to support the at least one LED.

4. The light-emitting structure of claim 3, wherein the support structure is further configured to support at least a portion of the flexible circuit member.

5. The light-emitting structure of claim 3, wherein the support structure comprises a substantially thermally conductive support structure.

6. The light-emitting structure of claim 5, wherein the substantially thermally conductive support structure comprises copper or aluminum.

7. The light-emitting structure of claim 1, wherein the flexible circuit member comprises at least one metallic layer and at least one dielectric layer.

8. The light-emitting structure of claim 1, wherein the flexible circuit member comprises at least one dielectric layer disposed between a plurality of metallic layers.

9. The light-emitting structure of claim 8, wherein at least one of the plurality of metallic layers is associated with an electrical p-contact member.

10. The light-emitting structure of claim 8, wherein at least one of the plurality of metallic layers is associated with an electrical n-contact member.

11. The light-emitting structure of claim 1, wherein the light-emitting structure further comprises an optical member.

12. The light-emitting structure of claim 11, wherein the optical member is less than about 200 microns away from a top surface of the LED.

13. The light-emitting structure of claim 11, wherein the optical member is in direct contact with a top surface of the LED.

14. The light-emitting structure of claim 11, wherein the optical member is a non-imaging collection optical member.

15. The light-emitting structure of claim 13, wherein a substantial portion of the optical member has an index of refraction less than about 1.4.

16. The light-emitting structure of claim 1, wherein the at least one LED comprises a dielectric function that varies spatially according to a pattern.

17. The light-emitting structure of claim 1, wherein the at least one LED has a surface area greater than about 1 mm$^2$.

18. A light-emitting structure, comprising:
    a support structure;
    a flexible circuit member;
    at least one LED supported by the support structure and attached to the flexible circuit member via a top surface of the at least one LED, the top surface including at least one portion through which light is emitted,
    wherein the light-emitting structure is free of wire bonds.

19. The light-emitting structure of claim 18, further comprising at least one contact bond pad in contact with at least one LED and bonded to the flexible circuit member, wherein the at least one contact bond pad is affixed to a top surface of the at least one LED.

* * * * *